United States Patent [19]

Zellmer

[11] Patent Number: 4,495,642
[45] Date of Patent: Jan. 22, 1985

[54] TIMING ANALYZER WITH COMBINATION TRANSITION AND DURATION TRIGGER

[75] Inventor: Joel A. Zellmer, Colorado Springs, Colo.

[73] Assignee: Hewlett-Packard Company, Palo Alto, Calif.

[21] Appl. No.: 352,672

[22] Filed: Feb. 26, 1982

[51] Int. Cl.³ .................. G01R 13/32; G06K 9/00
[52] U.S. Cl. .................. 382/1; 324/73 AT; 324/77 R; 324/121 R; 340/720; 364/487; 364/580
[58] Field of Search ............ 340/715, 720, 146.2; 315/379, 380; 364/487, 580; 382/1, 10, 69; 324/121 R, 121 E, 77 R, 77 A, 77 E, 77 G, 88, 404, 73 AT

[56] References Cited

U.S. PATENT DOCUMENTS

| | | | |
|---|---|---|---|
| 3,551,733 | 12/1970 | Johnson | 315/380 |
| 3,790,767 | 2/1974 | Alexander | 324/77 A |
| 4,100,532 | 7/1978 | Farnbach | 382/1 |
| 4,364,036 | 12/1982 | Shimizu | 324/121 R |
| 4,365,193 | 12/1982 | Bollero et al. | 324/77 A |
| 4,399,512 | 8/1983 | Soma et al. | 364/487 |

*Primary Examiner*—Leo H. Boudreau
*Attorney, Agent, or Firm*—Edward L. Miller

[57] ABSTRACT

A timing analyzer incorporates pattern transition and pattern duration triggering. A transition detector detects transitions into or out of selected patterns occurring among the inputs of the analyzer. A time duration comparator compares a selected logical sense of the pattern against a variable duration reference. The outputs of the transition detector and of the time duration comparator are combined with logic circuits to produce a qualified trigger signal indicative of a simple transition into or out of a selected pattern, duration of the pattern longer than some reference, or shorter than that reference.

5 Claims, 4 Drawing Figures

TIMING ANALYZER WITH COMBINATION TRANSITION AND DURATION TRIGGER

BACKGROUND AND SUMMARY OF THE INVENTION

Multi-channel timing analyzers are normally designed with the capability of generating pattern-match triggers encompassing all or a selected portion of the inputs to the analyzer. When the inputs match a particular pattern defined by the user, an output signal goes true which then triggers the start or stop of a data acquisition cycle.

Pattern trigger duration circuits are used to qualify the presence of a particular pattern by requiring it to be present for a defined period of time before it is recognized. Some circuits accomplish this by requiring a pattern to exist for a pre-set number of samples; others use analog timing circuitry for the duration qualification. The analog approach has an advantage in that an output trigger can be generated and used to trigger oscilloscopes, whereas circuits which synchronize the trigger to an internal sample clock cause jitter on the oscilloscope, making this feature much less useful.

This disclosure describes a technique for generating analog pattern duration qualification where the condition required can be pattern duration longer than a pre-set value, shorter than a pre-set value, or simply a transition into or away from the specified pattern. In addition, the capability of combining triggering on a particular group of inputs entering (or leaving) one state, when a second group of inputs have been in another state for a pre-settable time duration, is also described. The outputs of one or more trigger qualification circuits are combined to achieve these results. Each trigger qualification circuit includes a transition detector and variable time duration comparator, from whose outputs various logical combinations are derived that represent the desired trigger condition.

DESCRIPTION OF THE PREFERRED EMBODIMENT

Figure 1:
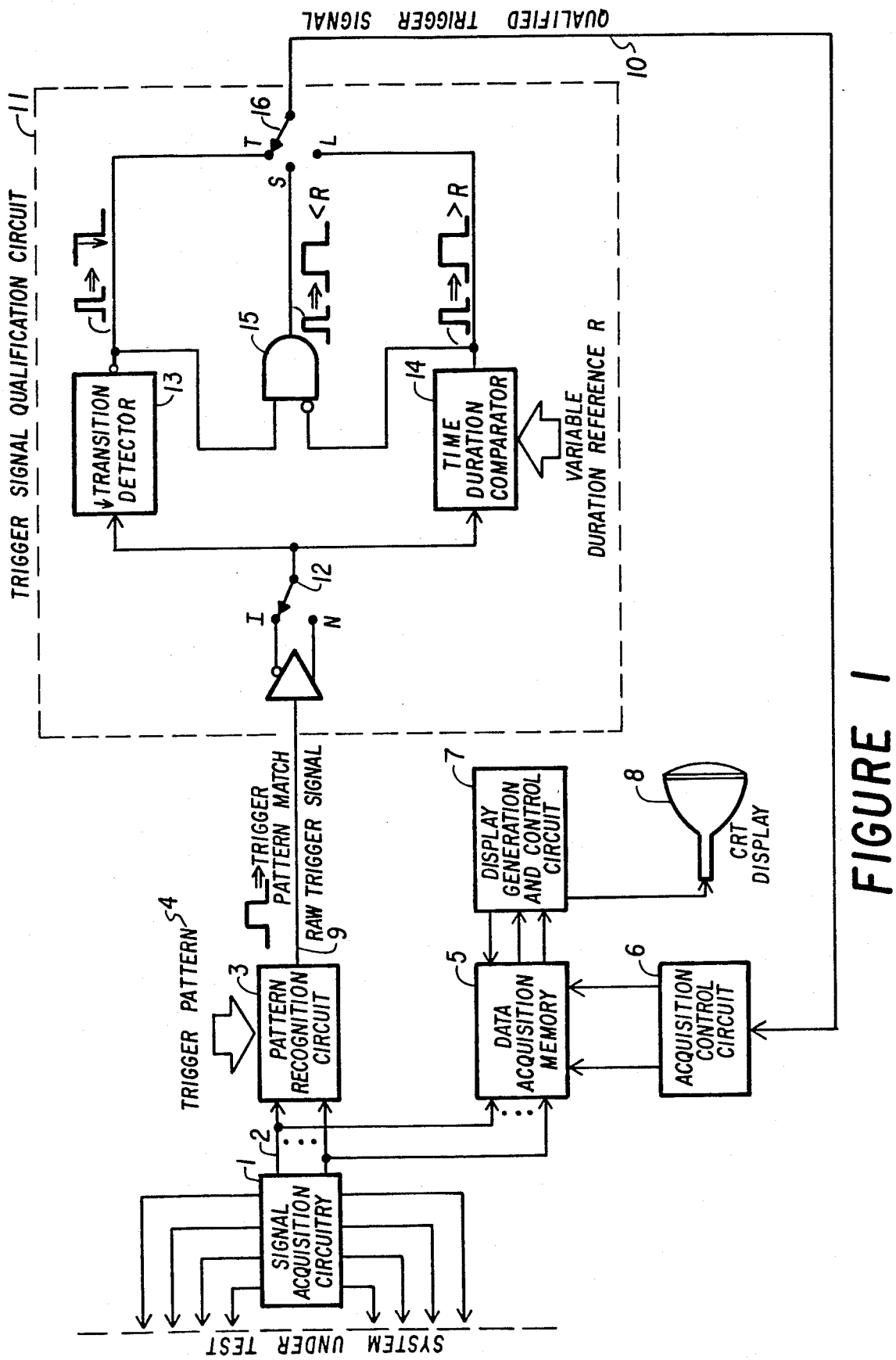
FIG. 1 is a general block diagram of a timing analyzer constructed in accordance with one preferred embodiment of the invention and including a trigger signal qualification circuit.

FIG. 1 depicts a highly generalized block diagram of a multichannel logic timing analyzer. A system under test (not explicitly shown) possesses internal "signals" and "clocks" to be measured as data by the timing analyzer. Signal acquisition circuitry 1 is coupled to the system under test via suitable connections that frequently include specialized probes coupled to signal conditioning circuits, high speed threshold comparators and high speed sampling circuits. The collection 2 of acquired, conditioned and sampled signals is coupled both to a pattern recognition circuit 3 and to a data acquisition memory 5. The latter stores the sampled data under the general control of an acquisition control circuit 6 until the measurement is complete, at which time the contents of the data acquisition memory 5 are displayed upon a CRT 8 by a display generation and control circuit 7.

The pattern recognition circuit 3 is responsive to a user-supplied trigger pattern 4 (not explicitly depicted) and produces an output 9 (raw trigger signal) whenever the input data collection 2 matches the selected trigger pattern. That output may be referred to as a raw trigger signal. In some less sophisticated logic timing analyzers this raw trigger signal is used, without further qualification, to bring about the more or less immediate end of the measurement. (A "start-on trigger" would be followed by a pre-selected number of samples, at which time the measurment is over. An "end-on trigger" simply halts the measurement, then and there.) In the embodiment of FIG. 1 (and of FIG. 3 to follow) the raw trigger signal from the analyzer's pattern recognition circuitry is further qualified in a particularly useful way before being applied to the acquisition control circuit 6 as a qualified trigger signal 10.

The qualification of the raw trigger signal 9 is performed by a trigger signal qualification circuit 11 that is responsive to selections among various operational modes made by the user. The overall modes that can be selected by the user are: (1) "transition triggering" (T); (2) pattern duration "longer than" (L); and (3), pattern duration "shorter than" (S). These overall modes can be pursued using either logical sense of the raw trigger signal so that six specific types of qualification are obtained. These six types are summarized in Table I below.

Figure 4:
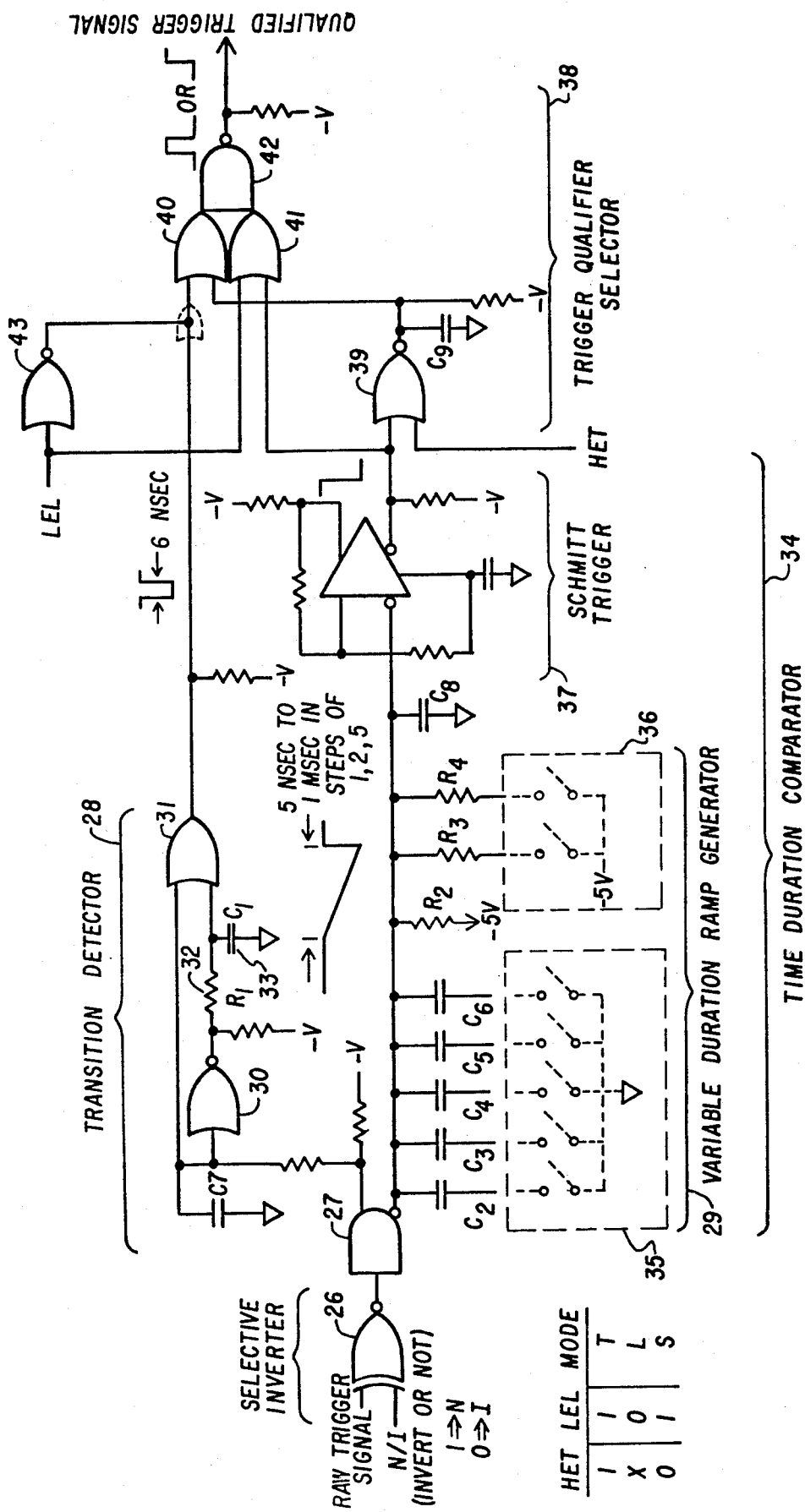
FIG. 4 is a simplified schematic diagram of the trigger signal qualification circuits of FIGS. 1 and 3.

The circuitry within the trigger signal qualification circuit 11 is shown in a somewhat idealized form in FIG. 1, so that its general principle of operation may be more readily understood. FIG. 4 illustrates the details of a particular actual circuit. A selection mechanism 12 responds to user commands by choosing either the inverted (I) or noninverted (N) logical sense of the raw trigger signal 9. The selected logical sense is supplied both to a transition detector 13, responsive to falling transitions by outputting a narrow pulse, and to a time duration comparator 14 that outputs a pulse if the selected logical sense of the raw trigger signal 9 exists longer than a duration selected by the user. In FIG. 1 that selected duration is denoted schematically by the notation "variable duration reference R." An AND gate 15 receives as inputs the output of the transition detector 13 and the complement of the output of the time duration comparator 14. A selection means 16 responsive to user commands selects one from among the following three outputs to become the qualified trigger signal 10: (1) the transition detector 13 (T); (2) AND gate 15 (S); and (3), the time duration comparator 14 (L). The function of each of the six combinations among I or N and T, S or L is set forth in Table I below.

TABLE I

TRIGGER SIGNAL QUALIFICATION MODES.

| IF CHOSEN THE COMBINATION IS | THEN THE MEANING OF THE QUALIFIED TRIGGER SIGNAL IS: "TRIGGER UPON ... |
|---|---|
| N & T | ... LEAVING A RECOGNIZED PATTERN" |
| I & T | ... ENTERING A RECOGNIZED PATTERN" |
| N & L | ... THE PRESENCE OF A RECOGNIZED PATTERN FOR LONGER THAN A SELECTED DURATION" |
| I & L | ... THE ABSENCE OF A RECOGNIZED PATTERN FOR LONGER THAN A SELECTED DURATION" |
| N & S | ... THE PRESENCE OF A RECOGNIZED PATTERN FOR LESS THAN A SELECTED DURATION"* |
| I & S | ... THE ABSENCE OF A RECOGNIZED PATTERN FOR LESS THAN A SELECTED DURATION"* |

*This circuit does not predict the future. The trigger will occur at the trailing transition in the recognized pattern if that should occur prior to the expiration of the selected duration.

Figure 2:
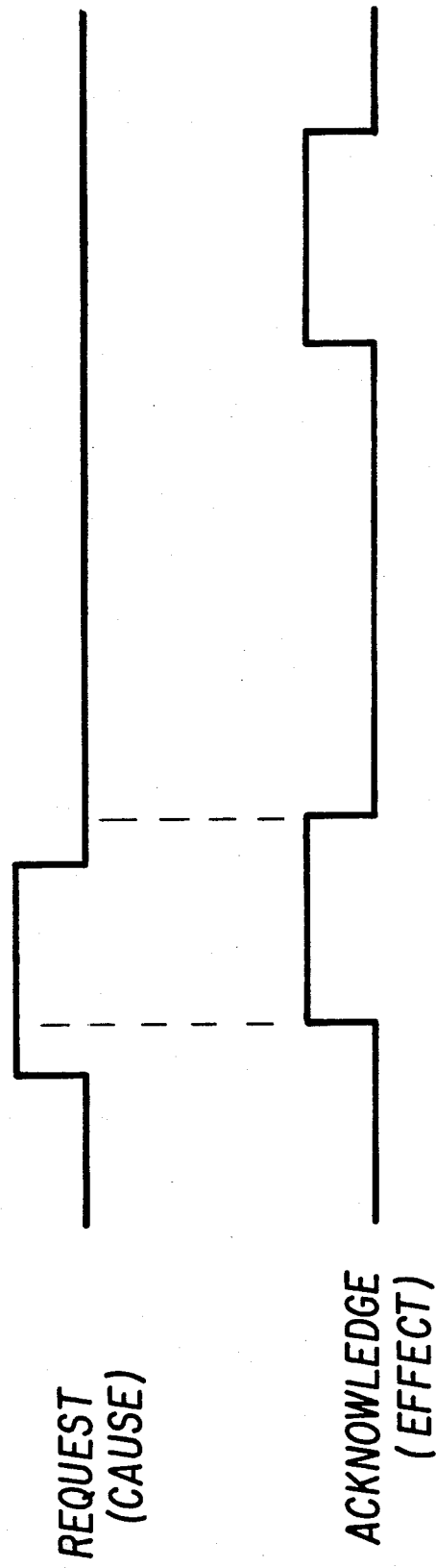
FIG. 2 is a timing diagram illustrating a trigger situation not readily accommodated by prior art timing analyzers.

As useful an improvement over the raw trigger signal 9 as the qualified trigger signal 10 is, there are some circumstances that cannot be triggered upon with an analyzer of the type shown in FIG. 1. FIG. 2 illustrates such a case, wherein a "REQUEST" occasions an "ACKNOWLEDGE". This type of example could involve a simple two-wire handshake, as is found in some computer peripherals, or the example could be generalized to the case where a certain pattern in a collection of signals occurs and is generally the sole or principal cause of the occurrence of a second pattern, which is indicative of some effect.

Suppose it is suspected that spurious acknowledgements are occurring, and that from this would stem certain trouble, and must therefore be corrected. Given the type of non-aligned occurrence illustrated in FIG. 2, all four possible combinations of REQUEST and ACKNOWLEDGE legitimately occur in the vicinity of a proper interaction of the two. Therefore, none of these can, by themselves, be used to uniquely identify the occurrence of a spurious ACKNOWLEDGE and trigger the analyzer.

Figure 3:
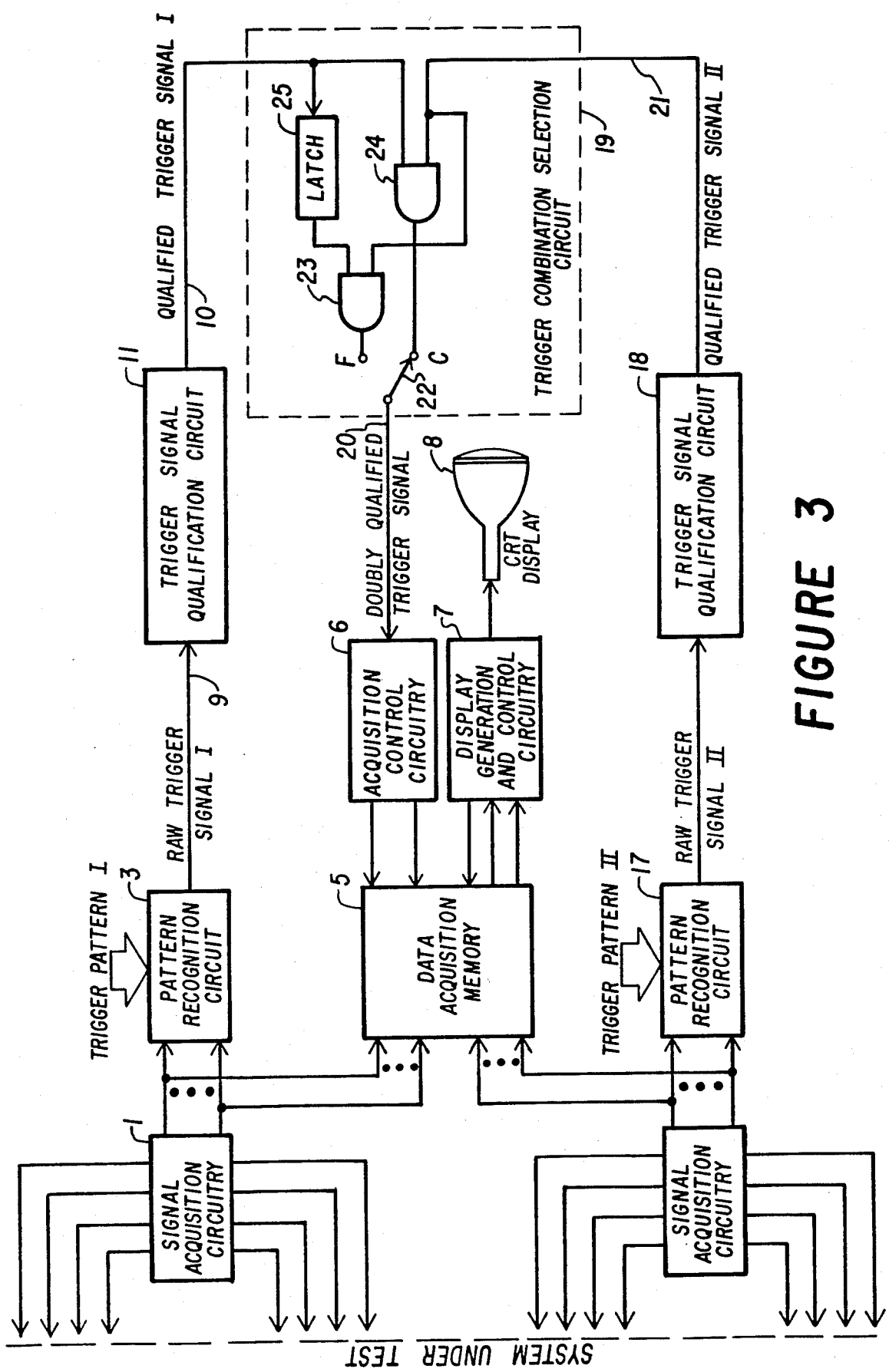
FIG. 3 is a general block diagram of a timing analyzer constructed in accordance with another preferred embodiment of the invention, and including a plurality of trigger signal qualification circuits and a trigger combination selection circuit.

FIG. 3 is a generalized block diagram of a timing analyzer similar to that of FIG. 1, but incorporating an additional pattern recognition circuit 17, a second trigger signal qualification circuit 18, and a trigger combination selection circuit 19 producing a doubly qualified trigger signal 20. The balance of the elements in FIG. 3 correspond to those of FIG. 1, and are denoted with the same reference numerals.

Trigger combination selection circuit 19 allows the selection of one of two modes for combining the qualified trigger signals I and II (10 and 21). These modes are denoted as "C" (for Combined) and "F" (for Followed-By). A selection means 22 responsive to user commands obtains the doubly qualified trigger signal 20 from the output of one of two AND gates 23 and 24 whose inputs represent the corresponding conditions. In the "C" position the trigger combination selection circuit 19 produces the doubly qualified trigger signal 20 if and only if both qualified trigger signals I and II are simultaneously true. This case represents the logical conjunction (by gate 24) of two independently selectable instances of the possibilities listed in Table I. In the other mode ("F"), qualified trigger signal I must occur and set latch 25, after which time the doubly qualified trigger signal 20 will be issued by AND gate 23 as soon as qualified trigger signal II 21 is true. These modes C and F are summarized in Table II below.

TABLE II

QUALIFIED TRIGGER COMBINATIONS.

| SELECTION | MEANING |
|---|---|
| C | TRIGGER ON SIMULTANEOUS SATISFACTION OF QUALIFICATION MODE I ON PATTERN I AND QUALIFICATION MODE II ON PATTERN II |
| F | ONCE PATTERN I MEETS QUALIFICATION MODE I TRIGGER AS SOON AS PATTERN II MEETS QUALIFICATION MODE II |

The analyzer of FIG. 3 has some seventy-two different ways to structure the meaning of the doubly qualified trigger signal 20. Table III lists the possibilities in compact form. The notation I(N,T) used in the Table means "raw trigger signal I meets qualification conditions N and T", as previously described.

TABLE III

DOUBLY QUALIFIED TRIGGER SIGNAL POSSIBILITIES.

| C & I(N,T) & | II(N,T) | F & I(N,T) & | II(N,T) |
|---|---|---|---|
| o | II(I,T) | o | II(I,T) |
|   | II(N,L) |   | II(N,L) |
| o | II(I,L) | o | II(I,L) |
| o | II(N,S) | o | II(N,S) |
|   | II(I,S) |   | II(I,S) |
| C & I(I,T) & | II(N,T) | F & I(I,T) & | II(N,T) |
| o | o | o | o |
| o | o | o | o |
| o | o | o | o |
| C & I(N,L) & | II(N,T) | F & I(N,L) & | II(N,T) |
| o | o | o | o |
| o | o | o | o |
| o | o | o | o |
| C & I(I,L) & | II(N,T) | F & I(I,L) & | II(N,T) |
| o | o | o | o |
| o | o | o | o |
| o | o | o | o |
| C & I(N,S) & | II(N,T) | F & I(N,S) & | II(N,T) |
| o | o | o | o |
| o | o | o | o |
| o | o | o | o |
| C & I(I,S) & | II(N,T) | F & I(I,S) & | II(N,T) |
| o | o | o | o |
| o | o | o | o |
| o | o | o | o |

While all of the possibilities listed in Table III are electronically unambiguous, and do, in fact, work, some of them don't do what a user might inadvertently expect them to. For example, the AND'ing of two transition requirements is a very tight condition indeed. In the notation of Table III this would be C & I(X,T) & II(X,T), where X denotes either N or I. In a timing analyzer capable of operating at several hundred megahertz the two transitions would have to occur within just a few nanoseconds of each other. Such a trigger selection essentially makes the uncertainties of the analyzer's operational extremes part of the circuit under test, and may raise more questions about the results than are answered by those results. In this particular instance it is probably more desirable to deny these particular trigger selections and allow the user to specify that raw trigger signals I and II are to be AND'ed together first, and then applied to a trigger signal qualification circuit set to identify transitions.

Another area where the user may be fooled concerns AND'ing a "shorter than" (S) requirement with a transition requirement: C & I(X,S) & II(X,T), or, C & I(X,T) & II(X,S). The danger here is that the user may forget that the circuits don't have predictive powers. That is, in order to determine that an S requirement is met for an associated duration of, say, ten micro-seconds, a transition out of some recognized pattern must occur. But not only can that transition happen any time during the ten micro-seconds, if the "AND" condition were met, it would actually mean that the pattern for the S requirement *had already gone away*. The "AND" that is met is between a signal denoting that fact and a signal representing the transition T that is subsequent to the expiration of the ten micro-seconds.

The basic difficulty in all of these cases is that the user approaches the analyzer through his own understanding of the controls and what the operating manual tells him. Experience suggests that neither of these reservoirs of information indicates to the user *exactly* what is going on inside the analyzer, so that he may take that into account. So, in the end it may simply be easiest to pretend to the user that the analyzer won't do something, rather than explain that sometimes it will and sometimes it won't, and that there is no way to tell which is which.

It will be noted, however, that the difficulty posed by the case discussed in connection with FIG. 2 is readily overcome with an analyzer having the triggering capabilities shown in FIG. 3 and Table III. In particular, it is then possible to trigger on REQUEST being low when ACKNOWLEDGE transitions from low to high. Now, in practice, the requirement "being low" implies "being low for at least some minimum duration", as there is bound to be skew between signals and propagation delay within the analyzer itself. To allow the user to specify "low" without explicitly mentioning for how long, would perhaps be misleading. In one actual analyzer using the circuitry of FIGS. 3 and 4, the guaranteed greatest upper bound for the minimum is five nanoseconds. So the real, explicit, specification in use is "trigger on ACKNOWLEDGE transitioning from low to high and REQUEST has been low for longer than five nanoseconds." That is, if "REQUEST equal low" is pattern I and "ACKNOWLEDGE equal high" is pattern II, then C & I(N,T) & II(N,L) will work, where the variable duration reference R for II(N,L) is five nanoseconds, (or perhaps even a longer value, if that suits the user).

FIG. 4 is a simplified schematic of a preferred implementation of the trigger signal qualification circuit 11 of FIG. 1, or 11 and 18 of FIG. 3. The raw trigger input signal from one of the pattern recognition circuits (or, perhaps a logical combination of the outputs from two or more such circuits) is applied to one input of an exclusive NOR gate 26. The other input to the gate 26 is a signal N/I that indicates whether to invert or not. The output of gate 26 is applied to a complementary output ECL line driver 27 whose non-inverting output is coupled to a transition detector 28 (corresponding to transition detector 13 of FIG. 1), and whose inverting output is applied to a variable duration ramp generator 29 (corresponding to the variable duration reference R of FIG. 1) which is part of a time duration comparator 34.

The operation of the transition detector 28 is as follows. NOR gate 30 serves to form the complement of the input to the transition detector. The input and its complement are both applied as inputs to OR gate 31, whose output would, in an ideal sense, always be true. However, the RC circuit of resistor 32 ($R_1$) and capacitor 33 ($C_1$) ensures a minimum interval of delay before a true signal can be felt at the lower input of OR gate 31. This delay is occasioned by a true-to-false transition in the signal fed into the transition detector 28, and its detection is indicated by a brief negative (true-false-true) pulse at the output of OR gate 31.

The operation of the time duration comparator 34 is as follows. When the inverting output of ECL line driver 27 goes false it allows one or more capacitors selected from among $C_2$-$C_6$ to begin charging negatively through a selected combination of $R_2$ through $R_4$. These selections are performed in advance through selection means 35 and 36, which may be RCA type CA 3045 and CA 3096, respectively. These, in turn, may be driven by a seven-bit value previously loaded into a TTL latch, such as a TI LS 273. In this way it is possible to select ramps of different slopes, so that various predetermined amounts of time (the variable duration reference R of FIG. 1) transpire from the start of the ramp until it reaches its other extreme. In this case the other extreme is the attainment by the ramp of a negative voltage sufficient to activate schmitt trigger 37. The schmitt trigger 37 can be made using a Motorola 10216. The output of the schmitt trigger 37 is normally high, and goes low at the expiration of the selected duration time interval.

The output of the transition detector 28 and the output of the schmitt trigger 37 are fed to a trigger qualifier selector 38 that responds to two control signals HET (High Equals Transition) and LEL (Low Equals Longer than) by selecting the desired type of trigger qualification. Briefly, the selector 38 operates as follows. For Mode T (transition triggering) the output of NOR gate 43 is made false while the bottom input to OR gate 40 is held false, to allow the usually true input at the top of gate 40 to be the sole determinant of the output of NAND gate 42. For mode L (Longer than) the top input of OR gate 40 is forced true and the top input of gate 41 forced low, so that the output of the schmitt trigger 37 alone determines the output from NAND gate 42. If the raw trigger signal remains suitable long enough, the ramp will switch the schmitt trigger 37. Otherwise, a premature change in the raw trigger signal will cause the output emitter follower in ECL line driver 27 to suck the charge out of the selected capacitors before the ramp switches the schmitt trigger 37. Finally, for mode S, the schmitt trigger 37 is given exclusive control over the NOR gate 39, whose output starts out low, and stays that way until the end of the ramp. That temporary low is applied to the bottom input of OR gate 40. The output of NOR gate 43 is forced low so that a high-to-low transition in the output of the transition detector 28 will not be absorbed. The top input of OR gate 40 will go false upon receipt of a sought-for transition in the raw trigger signal. During this time the top input of OR gate 41 is forced true, so that the output of NAND gate 42 is exclusively controlled by the output of the transition detector 28, which has until the schmitt trigger 37 switches to cause an output. After the schmitt trigger 37 switches, NOR gate 39 forces a high into gate 40, absorbing any output from the transition detector 28.

A final word is in order about $C_7$, $C_8$ and $C_9$. These defeat certain race conditions that might otherwise produce spurious triggers. $C_7$ requires a minimum raw trigger signal width for T-type triggering. $C_8$ functions as a minimum width filter for S-type triggering. $C_9$ prevents a race condition between the output of the transition detector 28 and the recharging of the ramp.

I claim:

1. A logic timing analyzer or the like, comprising:
    signal acquisition means for receiving a collection of fluctuating input data signals to be compared against logical thresholds and for producing from the fluctuating input data signals a corresponding collection of acquired signals;
    pattern recognition means coupled to the collection of acquired signals for causing a recognition signal to appear for any duration that the collection of acquired signals matches a preselected pattern and for causing the recognition signal to disappear for any duration that the collection of acquired signals differs from the preselected pattern;
    trigger signal generation means coupled to the recognition signal for producing a trigger signal when the duration between an appearance of the recognition signal and a subsequent disappearance thereof is less than a preselected duration;
    a data acquisition memory, coupled to the collection of acquired signals and the trigger signal, and responsive to the trigger signal by ceasing to store the collection of acquired signals after a predetermined amount of time subsequent to the occurrence of the trigger signal; and
    display means coupled to the data acquisition memory for displaying the contents thereof.

2. A trigger signal qualification circuit for timing analyzers and the like, comprising:
    a pattern recognition circuit responsive to input data signals by producing a recognition signal wherever the input data signals match a preselected pattern;
    selective inversion means coupled to the recognition signal for producing a trigger signal that represents a preselected logical sense of the recognition signal;
    transition detection means coupled to the trigger signal for detecting transitions therein from a first logical sense to a second logical sense and for producing a transition signal indicative thereof;
    time duration comparison means coupled to the trigger signal for detecting transitions therein from the second logical sense to the first logical sense and also for producing a time-out signal indicative of whether the amount of time since the most recent transition in the trigger signal from the second logical sense to the first logical sense is both free from a subsequent transition from the first logical sense to the second logical sense and is greater than a preselected duration;
    logic means coupled to the transition signal and to the time-out signal for producing an output signal whenever the transition signal occurs while the the time-out signal is absent; and
    selection means coupled to receive as inputs the transition signal, the time-out signal and the output of the logic means, for producing a qualified trigger signal upon the occurrence of a preselected one of the input coupled to the selection means.

3. A timing analyzer or the like incorporating the trigger signal qualification circuit of claim 2, further comprising:
    memory means coupled to the qualified trigger signal for storing samples of the input data signals and for responding to the qualified trigger signal by ceasing to store samples after a predetermined amount of time subsequent to the occurrence of the qualified trigger signal; and
    display means coupled to the memory means for displaying the contents thereof.

4. A combined qualified-trigger selection circuit for a timing analyzer or the like comprising a first trigger signal qualification circuit as in claim 2, the selection circuit further comprising:
    a second trigger signal qualification circuit as in claim 2;
    selection means coupled to first and second qualified trigger signals respectively produced by the first and second trigger signal qualification circuits for producing a doubly qualified trigger signal representing a preselected one of first and second conditions, the first condition being the logical conjunction of the first and second qualified trigger signals, and the second condition being the logical conjunction of the first qualified trigger signal and another signal indicating previous occurrence of the second qualified trigger signal.

5. A timing analyzer or the like incorporating the combined qualified-trigger selection circuit of claim 4, further comprising:
    memory means coupled to the doubly qualified trigger signal for storing samples of the input data signals and for responding to the doubly qualified trigger signal by ceasing to store samples after a predetermined amount of time subsequent to the occurrence of the doubly qualified trigger signal; and
    display means coupled to the memory means for displaying the contents thereof.

* * * * *

UNITED STATES PATENT AND TRADEMARK OFFICE
CERTIFICATE OF CORRECTION

PATENT NO. : 4,495,642

DATED : January 22, 1985

INVENTOR(S) : Joel A. Zellmer

It is certified that error appears in the above-identified patent and that said Letters Patent is hereby corrected as shown below:

Column 3, line 24, "occations" should read --occasions--

In the Claims

Claim 2, Column 7, line 47, "wherever" should read --whenever--

Claim 2, Column 8, line 17, "input" should read --inputs--

Signed and Sealed this

Sixth Day of August 1985

[SEAL]

Attest:

DONALD J. QUIGG

Attesting Officer  Acting Commissioner of Patents and Trademarks